US008987722B2

(12) United States Patent
Farmer

(10) Patent No.: US 8,987,722 B2
(45) Date of Patent: *Mar. 24, 2015

(54) SELF-ALIGNED BOTTOM-GATED GRAPHENE DEVICES

(71) Applicant: International Business Machines Corporation, Armonk, NY (US)

(72) Inventor: Damon Farmer, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/031,126

(22) Filed: Sep. 19, 2013

(65) Prior Publication Data

US 2014/0353754 A1 Dec. 4, 2014

Related U.S. Application Data

(63) Continuation of application No. 13/905,682, filed on May 30, 2013.

(51) Int. Cl.
| H01L 51/10 | (2006.01) |
| H01L 51/30 | (2006.01) |
| H01L 51/40 | (2006.01) |
| H01L 29/16 | (2006.01) |
| H01L 29/66 | (2006.01) |
| H01L 29/78 | (2006.01) |

(52) U.S. Cl.
CPC ...... *H01L 29/1606* (2013.01); *H01L 29/66477* (2013.01); *H01L 29/78* (2013.01)
USPC ........ 257/40; 257/29; 257/368; 257/E51.005; 257/E51.025; 438/151; 438/299

(58) Field of Classification Search
None
See application file for complete search history.

(56) References Cited

U.S. PATENT DOCUMENTS

| 7,952,088 | B2 | 5/2011 | Anderson et al. | |
| 8,106,383 | B2 | 1/2012 | Jenkins et al. | |
| 8,124,463 | B2 | 2/2012 | Chen et al. | |
| 8,285,082 | B2* | 10/2012 | Heck | 382/305 |
| 8,344,358 | B2 | 1/2013 | Avouris et al. | |
| 8,445,320 | B2 | 5/2013 | Avouris et al. | |
| 2010/0075469 | A1 | 3/2010 | Liu et al. | |
| 2011/0089403 | A1* | 4/2011 | Woo et al. | 257/29 |
| 2011/0284818 | A1 | 11/2011 | Avouris et al. | |
| 2011/0309334 | A1 | 12/2011 | Chang et al. | |
| 2012/0188006 | A1* | 7/2012 | Sanduleanu et al. | 327/552 |
| 2012/0248428 | A1 | 10/2012 | Yamashita et al. | |
| 2012/0292602 | A1 | 11/2012 | Guo et al. | |

(Continued)

OTHER PUBLICATIONS

D. B. Farmer et al., "Graphene field-effect transistors with self-aligned gates," Applied Physics Letters, vol. 97. 2010 American Institute of Physics, Issue 1, 2010, Jan. 31, 2003, 3 pages.

(Continued)

*Primary Examiner* — Joseph Schoenholtz
(74) *Attorney, Agent, or Firm* — Fleit Gibbons Gutman Bongini & Bianco PL; Thomas Grzesik

(57) ABSTRACT

A carbon-based semiconductor structure includes a substrate and a gate stack. The gate stack includes a carbon-based gate electrode formed on the substrate. The gate stack also includes a gate dielectric formed on the carbon-based gate electrode. The gate stack further includes a carbon-based channel formed on the gate dielectric.

14 Claims, 9 Drawing Sheets

(56) References Cited

U.S. PATENT DOCUMENTS

| | | |
|---|---|---|
| 2012/0329260 A1 | 12/2012 | Avouris et al. |
| 2013/0009133 A1 | 1/2013 | Avouris et al. |
| 2013/0099223 A1 | 4/2013 | Kobayashi |
| 2013/0299782 A1 | 11/2013 | Afzali-Ardakani et al. |
| 2013/0302963 A1 | 11/2013 | Afzali-Ardakani et al. |

OTHER PUBLICATIONS

L. Liao et al., "High-speed graphene transistors with a self-aligned nanowire gate," Nature, vol. 467, 2010 Macmillan Publishers Limited, 2010, pp. 305-308.

A, Badmaev et al., "Self-Aligned Fabrication of Graphene RF Transistors with T-Shaped Gate," ACS Nano, vol. 6, No. 4, Mar. 10, 2012, pp. 3371-3376. Department of Electrical Engineering, University of Southern California, Los Angeles, California 90089, United States.

S.-J. Han et al., "High-frequency graphene voltage amplifier," Nano Letters, vol. 11, No. 9, 2011, pp. 3690-3693.

A. Afzali-Ardakani et al., "Graphene Transistors with Self-Aligned Gates," U.S. Appl. No. 13/468,092, filed May 10, 2012.

Non Final Office Action dated Mar. 27, 2014 received for U.S. Appl. No. 13/905,682.

* cited by examiner

SELF-ALIGNED BOTTOM-GATED GRAPHENE DEVICES

CROSS-REFERENCE TO RELATED APPLICATIONS

This application is based upon and claims priority from prior U.S. patent application Ser. No. 13/905,682, filed on May 30, 2013, the entire disclosure of which is herein incorporated by reference in its entirety.

BACKGROUND

The high mobility of charge carriers in graphene combined with the ability to modulate the carrier concentration by an external electric field has made graphene-based field-effect transistors (GFETs) promising candidates for future high frequency applications. One of the critical factors limiting the ultimate performance of graphene FETs is the parasitic series resistance between the source/drain contacts and the gated graphene channel. While these access regions serve to reduce the parasitic capacitance between the gate and the source/drain electrodes, their resistance results in a lower current that hinders the device performance.

BRIEF SUMMARY

In one embodiment, a method for forming a carbon-based semiconductor structure is disclosed. The method comprises forming a carbon-based gate electrode layer on a substrate. A gate dielectric layer is formed on the carbon-based gate electrode layer. A carbon-based channel layer is formed on the gate dielectric layer.

In another embodiment, a carbon-based semiconductor structure is disclosed. The carbon-based semiconductor structure comprises a substrate and a gate stack. The gate stack comprises a carbon-based gate electrode formed on the substrate. The gate stack also comprises a gate dielectric formed on the carbon-based gate electrode. The gate stack further comprises a carbon-based channel formed on the gate dielectric.

In yet another embodiment, a non-transitory tangible computer readable medium encoded with a program for fabricating an integrated circuit structure is disclosed. The program comprises instructions configured to perform a method. The method comprises forming a carbon-based gate electrode layer on a substrate. A gate dielectric layer is formed on the carbon-based gate electrode layer. A carbon-based channel layer is formed on the gate dielectric layer.

In a further embodiment an integrated circuit is disclosed. The integrated circuit comprises a carbon-based semiconductor device. The carbon-based semiconductor device comprises a substrate and a gate stack. The gate stack comprises at least a carbon-based gate electrode formed on the substrate. The gate stack also comprises a gate dielectric formed on the carbon-based gate electrode. The gate stack further comprises a carbon-based channel formed on the gate dielectric.

BRIEF DESCRIPTION OF THE SEVERAL VIEWS OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

As will be discussed in greater detail below, various embodiments provide one or more methods to fabricate self-aligned, bottom-gated graphene FET devices. In the resulting structure(s) the gate electrode aligns with the source and drain electrodes without requiring lithographic alignment procedures. In one embodiment, a gate stack comprising at least a bottom graphene or graphite gate electrode, a gate dielectric, and a graphene channel, is formed. After the bottom-gate electrode is electrically isolated, the source and drain electrodes are formed by conformal deposition of a conducting material on the gate stack and surrounding substrate surface. The source and drain electrodes are then isolated by either lift-off processing or polishing. One advantage of various embodiments is that the bottom-gating and self-alignment are combined. The self-aligned gating minimizes parasitic resistances. This enhances the performance of the device for high-frequency electronics. Also, lithographic alignment processes and ion implantation doping to are not required to achieve the alignment of source/drain and gate electrodes. In addition, the bottom-gate configuration and the formation of the gate dielectric before the graphene channel allows for a wide array of dielectrics and dielectric post-deposition processing to be used.

Figure 1:
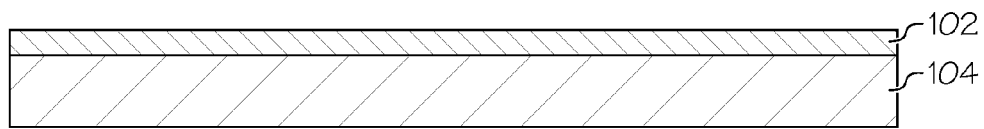
FIG. 1 is a cross-sectional diagram illustrating a carbon-based gate electrode layer having been deposited or grown on a substrate according to one embodiment of the present invention.

FIG. 1 is a cross-sectional diagram illustrating a structure comprising a graphene or graphite gate electrode layer 102 formed on an insulating substrate 104. The gate electrode layer 102, in one embodiment, is mechanically exfoliated, transferred, or epitaxially grown on the insulating substrate 104. When the gate electrode layer 102 is deposited, e.g., using mechanical exfoliation, the substrate 104 can be an insulating wafer or a wafer with an insulating overlayer, such as a silicon (Si) wafer covered with silicon dioxide ($SiO_2$). When the gate electrode layer 102 is grown, e.g., by silicon sublimation with epitaxy, substrate 104 can be a silicon carbide (SiC) wafer. Techniques for depositing a graphene layer(s) on a substrate that involve, for example, exfoliation and/or techniques for growing a graphene layer(s) on a substrate that involve, for example, SiC epitaxy, are known to those of skill in the art and thus are not described further herein.

Figure 2:
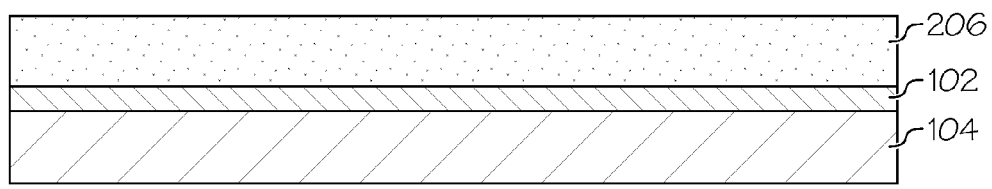
FIG. 2 is a cross-sectional diagram illustrating a gate dielectric layer having been formed on the carbon-based gate electrode layer according to one embodiment of the present invention.
Figure 3:
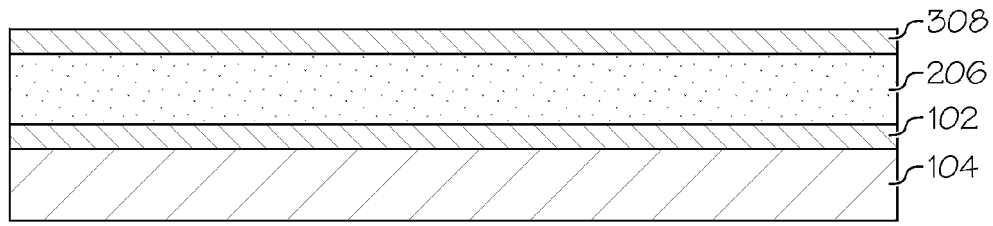
FIG. 3 is a cross-sectional diagram illustrating a graphene channel material having been formed on the gate dielectric layer according to one embodiment of the present invention.

A gate dielectric layer 206 is globally deposited on the gate electrode layer 102, as shown in FIG. 2. In one embodiment, the gate dielectric layer 206 is formed/deposited over the entire gate electrode layer 102 and remains conductive after this process. Examples of applicable dielectric layers are boron nitride and diamond-like carbon (DLC). A graphene channel material 308 is deposited/formed on the gate dielectric layer 206. The graphene channel material 308, in one embodiment, is mechanically exfoliated, transferred, or epitaxially grown on the gate dielectric layer 206.

Graphene is a structure consisting of carbon atoms as a two-dimensional sheet. A graphene monolayer has a thickness of about 0.34 nm. The graphene channel material 308 can be a monolayer of a two-dimensional sheet. Alternately, the graphene channel material 308 can be a stack of a plurality of two-dimensional monolayers of carbon, which typically do not exceed more than 10 monolayers. More typically, the graphene channel material 308 is limited to less than 5 monolayers. Graphene provides excellent in-plane conductivity. Within each monolayer of graphene in graphene channel material 308, carbon atoms are arranged in a two-dimensional honeycomb crystal lattice in which each carbon-carbon bond has a length of about 0.142 nm.

Figure 4:
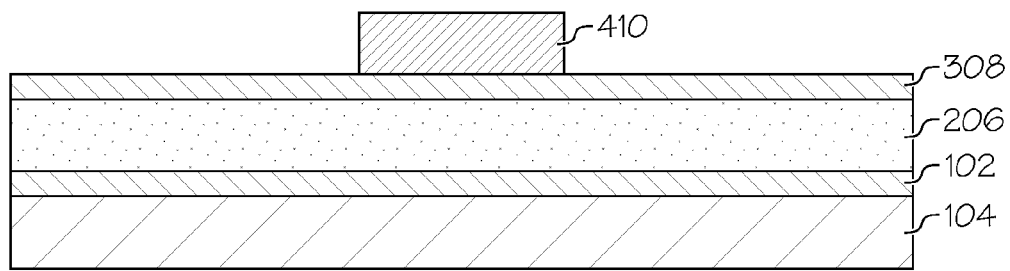
FIG. 4 is a cross-sectional diagram illustrating a masking material patterned over the graphene channel material according to one embodiment of the present invention.

FIG. 4 shows that lithography techniques are employed to define the dimensions of a graphene-based device to be subsequently formed. The lithographic patterning of the graphene channel material 308, the gate dielectric layer 206, and the gate electrode layer 102 can be effected by masking the desired area of the graphene channel material 308 with a non-destructive masking material 410, which can be, for example, a layer of poly(methyl methacrylate), i.e., PMMA. The masking material 410 is lithographically patterned by exposure and development into a desired pattern, which can be, for example, a rectangular pattern such that the width of the masking material 410 is the desired width for the channel of a graphene based transistor to be subsequently formed.

Figure 5:
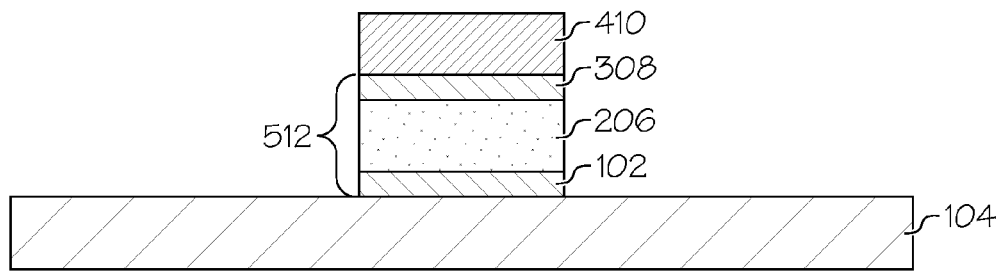
FIG. 5 is a cross-sectional diagram illustrating a gate stack having been formed on the substrate according to one embodiment of the present invention.

Employing the masking material 410 as an etch mask, the exposed portions of the graphene channel material 308, the gate dielectric layer 206, and the gate electrode layer 102 can be etched by, for example, subjecting the unmasked portions of the graphene channel material 308, the gate dielectric layer 206, and the gate electrode layer 102 to oxygen plasma. This etching process forms a columnar gate stack 512, as shown in FIG. 5. The gate stack 512 comprises a portion of the graphene channel material 308, a portion of the gate dielectric layer 206, and a portion of the gate electrode layer 102, where the ends of the graphene channel 308 are electrically accessible at the sidewalls of the stack 512. It should be noted that the same or different etching techniques can be utilized to etch each of the unmasked portions of the graphene channel material 308, the gate dielectric layer 206, and the gate electrode layer 102, where the etching process(es) leaves the ends of the graphene channel 308 electrically accessible at the sidewalls of the stack 512. For example, in one embodiment where DLC is used for the gate dielectric layer 206 oxygen plasma reactive ion etching (RIE) can be used to etch the entire gate stack 512.

Figure 6:
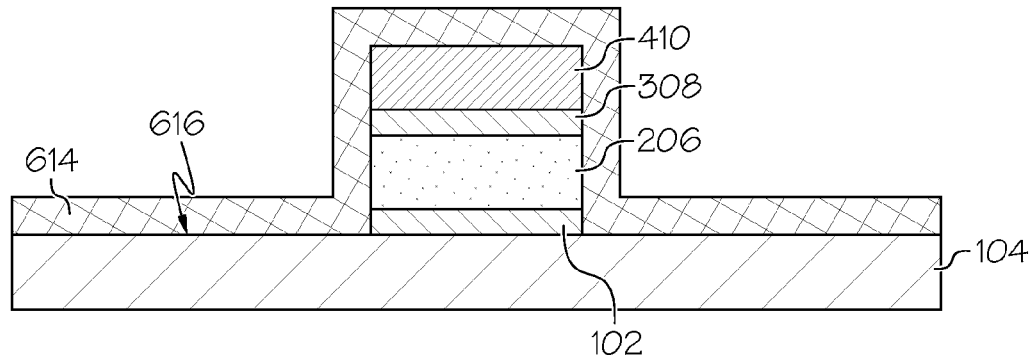
FIG. 6 is a cross-sectional diagram illustrating an insulating material having been conformally deposited on the gate stack and the surface of the substrate according to one embodiment of the present invention.
Figure 7:
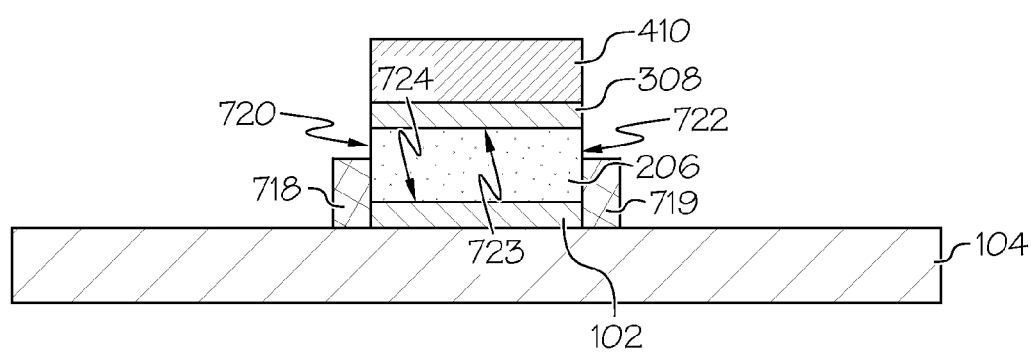
FIG. 7 is a cross-sectional diagram illustrating a set of spacers having been formed from the insulating material according to one embodiment of the present invention.

An insulating spacer material 614, such as (but not limited) silicon nitride, is conformally deposited on the gate stack 512 and the surface 616 of the substrate 104, as shown in FIG. 6. The insulating spacer material 614 can be deposited using, for example, chemical vapor deposition (CVD), atomic layer deposition (ALD), or a combination thereof. Etching techniques such as (but not limited to) RIE can then be used to directionally etch the spacer material 614. This etching process creates spacers 718, 719 on at least a portion of the vertical sidewalls 720, 722 of the gate stack 512, as shown in FIG. 7. The spacers 718, 719 electrically isolate the bottom-gate electrode 102 while leaving the ends of the graphene channel 308 electrically accessible. In this embodiment, the height of the spacers 718, 719 is below a bottom surface 723 of the graphene channel 308 and above a top surface 724 of the bottom-gate electrode 102.

Figure 8:
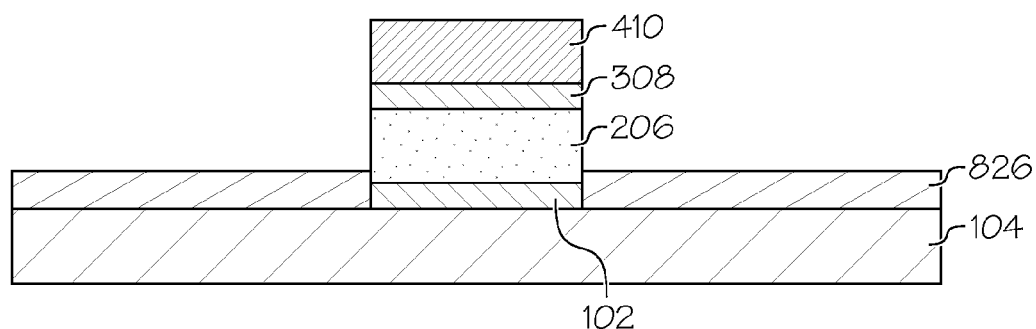
FIG. 8 is a cross-sectional diagram illustrating another structure where the spacers of FIG. 7 are not formed, and where an oxide layer is formed from the substrate according to one embodiment of the present invention.
Figure 9:
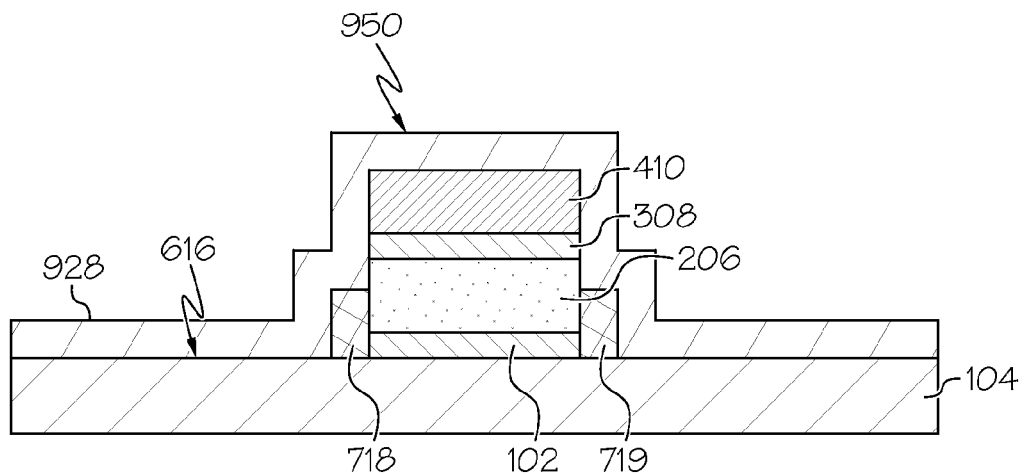
FIG. 9 is a cross-sectional diagram illustrating a conductive material having been conformally deposited onto and over the surface of the substrate, the spacers, the gate stack, and the mask of the structure illustrated in FIG. 7 according to one embodiment of the present invention.

In another embodiment, the insulating spacer material 614 and subsequent spacers 718, 719 are not formed. For example, if the substrate 104 on which the gate stack 512 sits can be oxidized, the native oxide formed during gate stack etching is sufficient to create an oxide 826 that sufficiently isolates the graphene gate electrode, as shown in FIG. 8. As an example, in an embodiment where epitaxial graphene is used as the gate electrode 102, silicon dioxide is readily formed on the silicon carbide surface (the substrate 104) and grows in a way that produces oxide 826 both above and below the original surface of the substrate 104. In one embodiment, the oxide 826 is formed on both sides of the gate stack 512 and extends above a top surface of the gate electrode layer 102.

Figure 10:
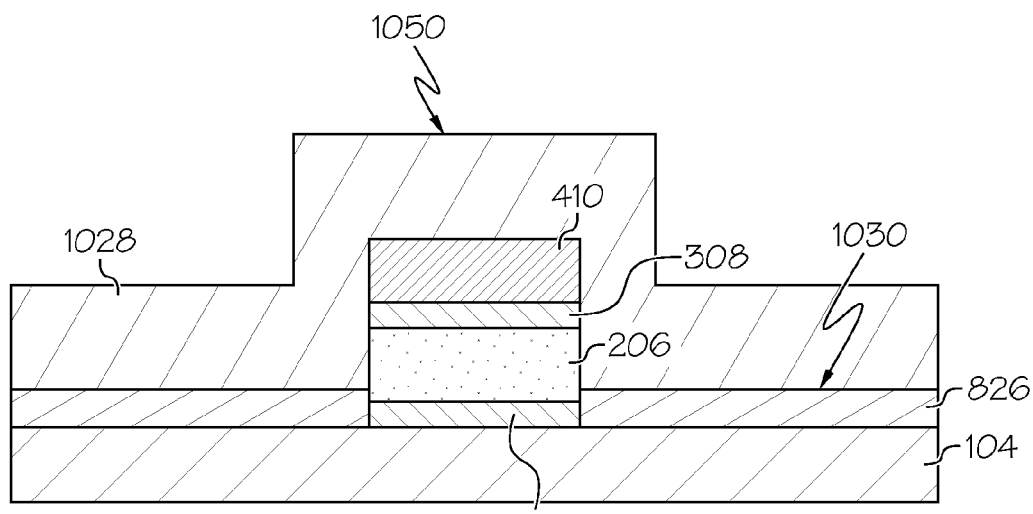
FIG. 10 is a cross-sectional diagram illustrating a conductive material having been conformally deposited onto and over the surface of the oxide layer, the gate stack, and the mask of the structure illustrated in FIG. 8 according to one embodiment of the present invention.
Figure 11:
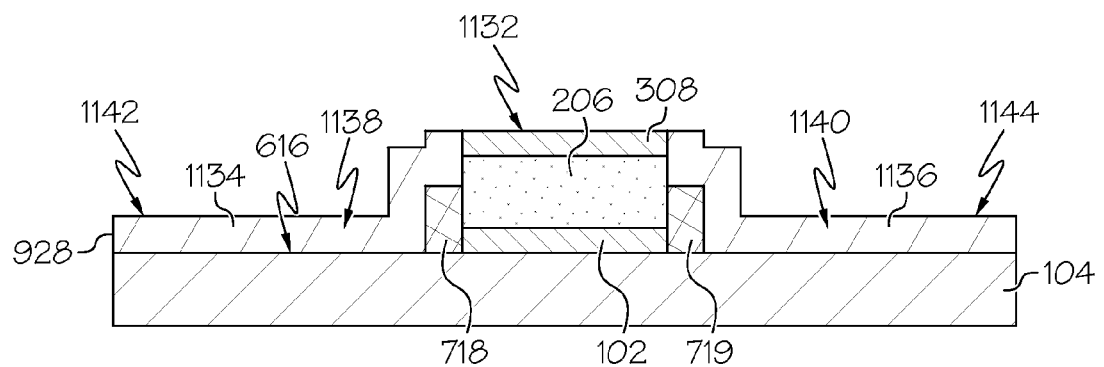
FIG. 11 is a cross-sectional diagram illustrating source and drain electrodes having been formed based on the structure illustrated in FIG. 9 according to one embodiment of the present invention.
Figure 12:
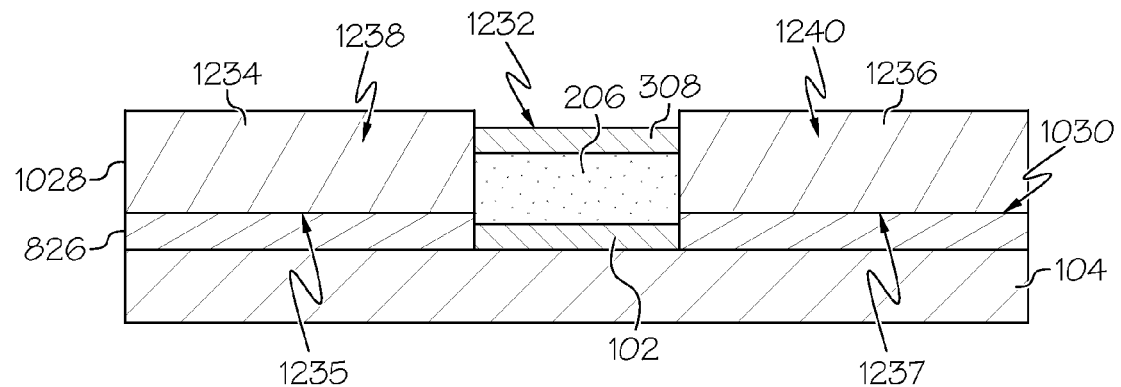
FIG. 12 is a cross-sectional diagram illustrating source and drain electrodes having been formed based on the structure illustrated in FIG. 10 according to one embodiment of the present invention.

After the spacers 718, 719 have been formed, a conductive material 928 such as (but not limited to) gold is conformally deposited onto and over the surface 616 of the substrate 104, the spacers 718, 719, the gate stack 512, and the mask 410. In an embodiment where the spacers 718, 719 are not formed and the oxide layer 826 is formed, the conductive material 1028 is conformally deposited onto and over the surface 1030 of the oxide layer 826, the gate stack 512, and the masking material 410, as shown in FIG. 10. In one embodiment, the conductive layer 1028 can range in thickness from 3 nm to 500 nm. However, other thicknesses are applicable as well. Once the conductive material/layer 928, 1028 has been deposited the masking material 410 is removed. For example, if the masking materiel 410 is PMMA the masking material can be dissolved in an acetone bath. This allows for the portion 950, 1050 of the conductive material 928, 1028 above the channel 308 to be lifted off exposing at least a top portion 1132, 1233 of the channel 308, as shown in FIGS. 11 and 12. In one embodiment, the lift-off process can be done in acetone heated to, for example, 55 degrees Celsius with slight agitation for one hour to remove the conductive layer 1028 on top of and on the sidewalls of the masking material 410. However, other lift-off processes are applicable as well.

FIGS. 11 and 12 each show one embodiment of the resulting device structure where the lift-off process separates and defines a source electrode 1134, 1234 and a drain electrode 1136, 1236 on each side of the gate stack 512 from a first portion 1138, 1238 and second portion 1140, 1240 of the conductive layer 928, 1028 respectively. In these embodiments, the source electrode 1134, 1234 and drain electrode 1136, 1236 have a thickness such that they make contact with the channel material 308 after lift-off and are isolated from each other. In one example, the horizontal portions 1142, 1144 of the source electrode 1134 and the drain electrode 1136 formed on the surface 616 of the substrate 104 have a height that is less than the height of the spacer 718, 719. However, other dimensions/thicknesses are applicable as well. In another example the portions of the source electrode 1234 and the drain electrode 1236 formed on the surface 1030 of the oxide layer 826 have a height that is greater than the gate stack 512 (i.e., the graphene channel material 308, the gate dielectric layer 206, and the gate electrode layer 102). However, other dimensions/thicknesses are applicable as well.

The source electrode 1134 of the structure illustrated in FIG. 11 contacts at least a first portion of the substrate 104, a vertical wall of the spacer 718, a horizontal wall of the spacer 718, a portion of the gate dielectric 206, and the graphene channel 308 (either partially or in its entirety). The drain electrode 1136 contacts at least a second portion of the substrate 104, a vertical wall of the spacer 719, a horizontal wall of the spacer 719, the gate dielectric 206 (either partially or in its entirety), and the graphene channel 308 (either partially or in its entirety). The source electrode 1234 of the structure illustrated in FIG. 12 contacts at least a first portion 1235 of the oxide layer 826, a portion of the gate dielectric 206, and the graphene channel 308 (either partially or in its entirety). If the masking material 410 is not removed the source electrode 1234 can also contact the masking material 410 (either partially or in its entirety). The drain electrode 1236 contacts at least a second portion 1237 of the oxide layer 826, the gate dielectric 206 (either partially or in its entirety), and the graphene channel 308 (either partially or in its entirety). If the mask 410 is not removed the drain electrode 1236 can also contact the masking material 410 (either partially or in its entirety).

Figure 13:
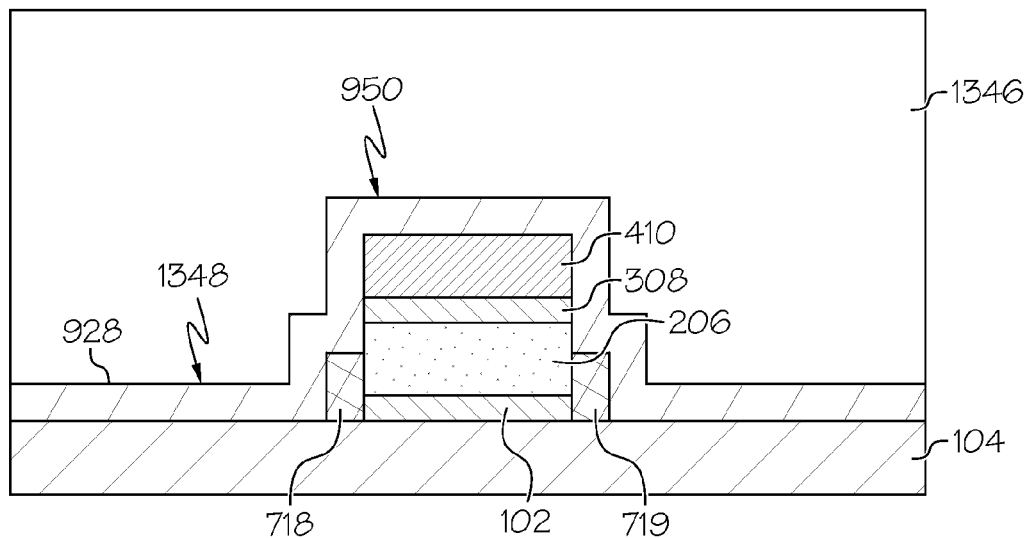
FIG. 13 is a cross-sectional diagram illustrating another structure where a planarizing material has been formed over the structure shown in FIG. 9 according to one embodiment of the present invention.
Figure 14:
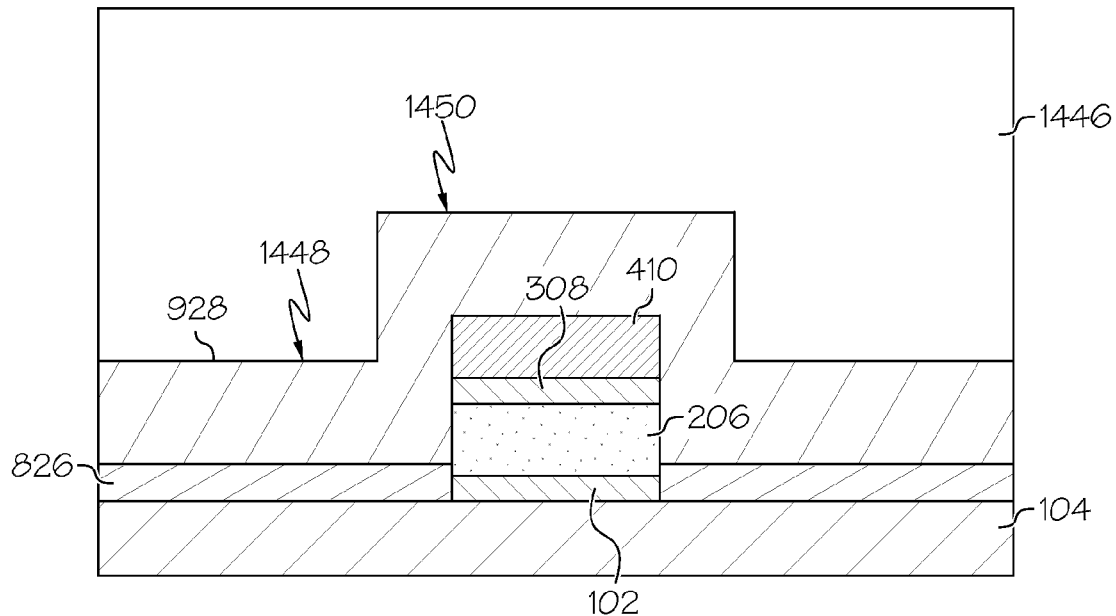
FIG. 14 is a cross-sectional diagram illustrating another structure where a planarizing material has been formed over the structure shown in FIG. 10 according to one embodiment of the present invention.

It should be noted that, in another embodiment, the lift-off process discussed above is not performed. In this embodiment, a planarizing layer 1346, 1446 such as (but not limited to) a metal-oxide film or an organic polymer is deposited onto a surface 1348, 1448 of the conductive layer 928, 1028, as shown in FIGS. 13 and 14. Polishing is then performed on the planarizing layer 1346, 1446 until the portion 1350, 1450 of the conductive layer 928, 1028 above the channel 308 is removed, thereby exposing the masking material 410. This polishing process separates and defines a source electrode 1534, 1634 and a drain electrode 1636 on each side of the gate stack 512 from a first portion 1538, 1638 and second portion 1540, 1640 of the conductive layer 928, 108 respectively.

Figure 15:
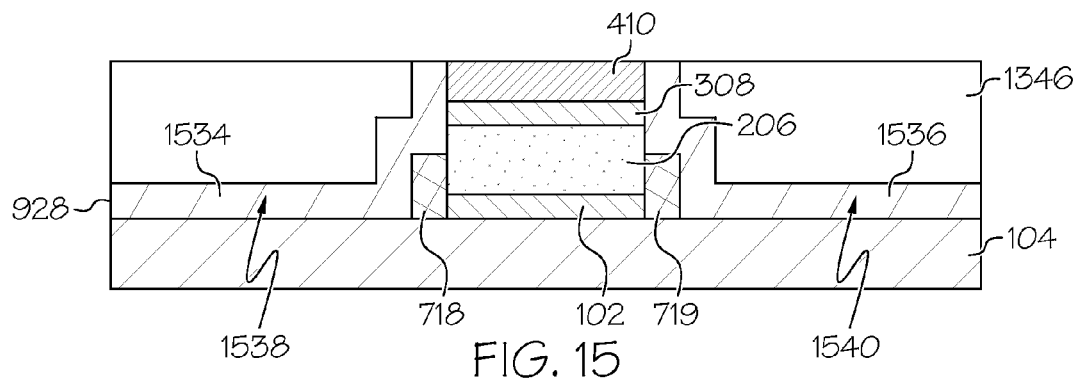
FIG. 15 is a cross-sectional diagram illustrating source and drain electrodes having been formed based on the structure illustrated in FIG. 13 according to one embodiment of the present invention.

The source electrode 1534 of the structure illustrated in FIG. 15 contacts at least a first portion of the substrate 104, a vertical wall of the spacer 718, a horizontal wall of the spacer 719, a portion of the gate dielectric 206, and the graphene channel 308 (either partially or in its entirety). The masking material 410, which can be any non-conducting patternable material, can then be subsequently removed. However, if the masking material 410 is not removed the source electrode 1526 can also contact the masking material 410 (either partially or in its entirety). The drain electrode 1536 contacts at least a second portion of the substrate 104, a vertical wall of the spacer 719, a horizontal wall of the spacer 719, the gate dielectric 206 (either partially or in its entirety), and the graphene channel 308 (either partially or in its entirety). If the mask 410 is not removed the drain electrode 1536 can also contact the mask 410 (either partially or in its entirety).

Figure 16:
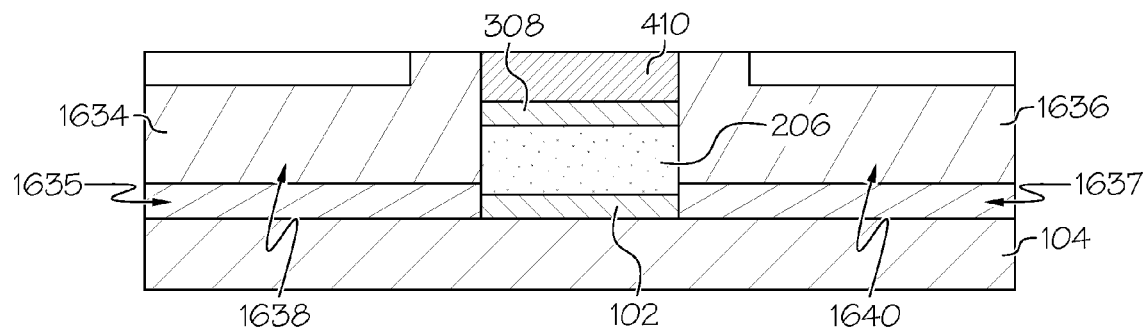
FIG. 16 is a cross-sectional diagram illustrating source and drain electrodes having been formed based on the structure illustrated in FIG. 14 according to one embodiment of the present invention.

The source electrode 1634 of the structure illustrated in FIG. 16 contacts at least a first portion 1635 of the oxide layer 826, a portion of the gate dielectric 206, and the graphene channel 308 (either partially or in its entirety). If the masking material 410 is not removed the source electrode 1634 can also contact the masking material 410 (either partially or in its entirety). The drain electrode 1636 contacts at least a second portion 1637 of the oxide layer 826, the gate dielectric 206 (either partially or in its entirety), and the graphene channel 308 (either partially or in its entirety). If the masking material 410 is not removed the drain electrode 1636 can also contact the mask 410 (either partially or in its entirety).

Figure 17:
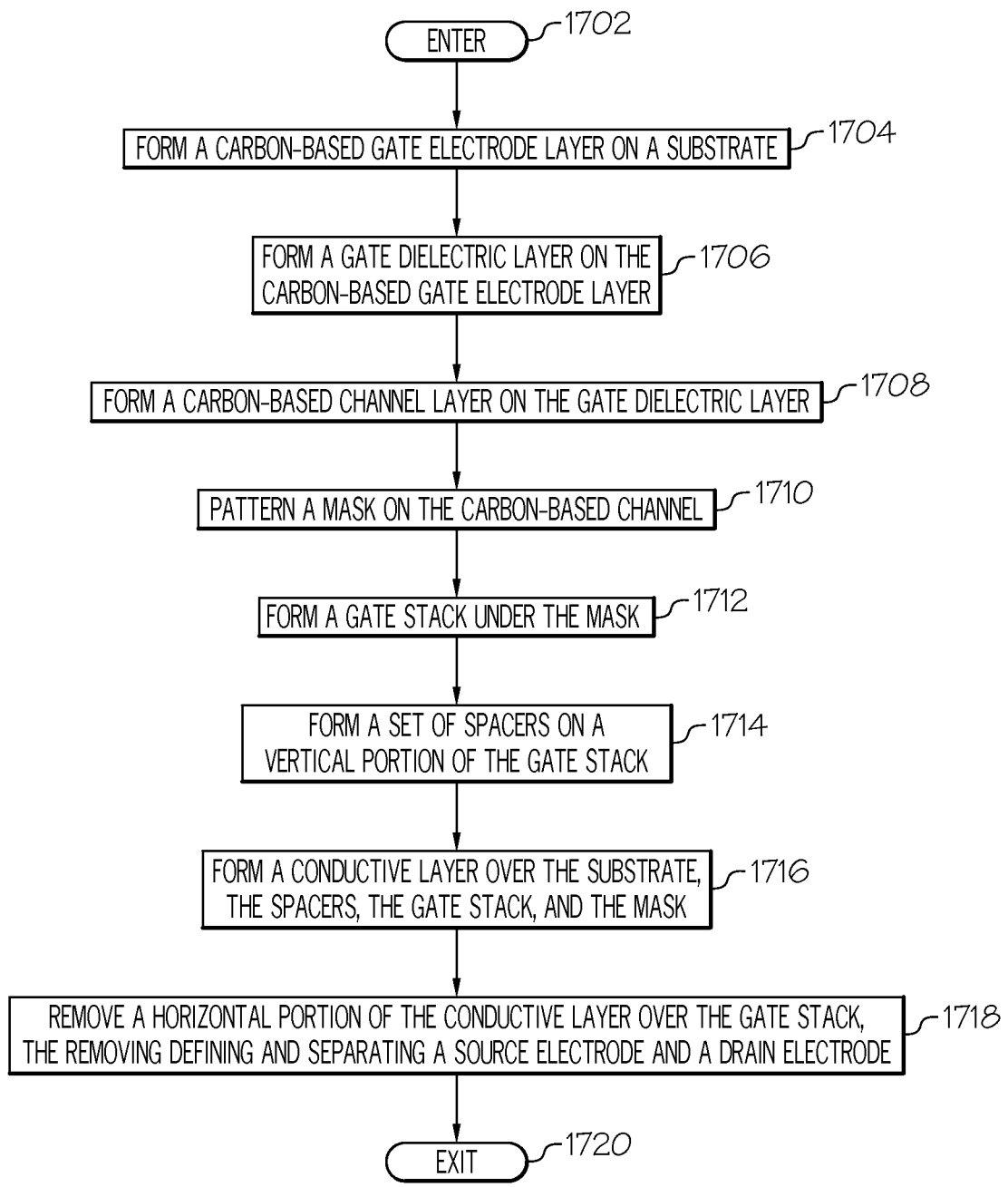
FIG. 17 is an operational flow diagram illustrating one example of a process for fabricating a carbon-based semiconductor structure.

FIG. 17 is an operational flow diagram illustrating a process for fabricating a carbon-based semiconductor structure. The operational flow diagram of FIG. 17 begins at step 1702 and flows directly to step 1704. A carbon-based gate electrode layer 102, at step 1704, is formed on a substrate 104. A gate dielectric layer 206, at step 1706, is formed on the carbon-based gate electrode layer 102. A carbon-based channel layer 308, at step 1708, is formed on the gate dielectric layer 206. A mask 410, at step 1710, is patterned on the carbon-based channel layer 308. A gate stack 512, at step 1712, is formed under the masking material 410. A set of spacers 718, 719, at step 1714, is formed on a vertical portion of at least the gate stack 512. A conductive layer 928, at step 1716, is formed over the substrate 104; the spacers 718, 719; the gate stack 512; and the mask 410. A horizontal portion 950 of the conductive layer 928 over the gate stack 512, at step 1718, is removed to define and separate a source electrode 1134 and a drain electrode 1136. The control flow exits at step 1720.

Figure 18:
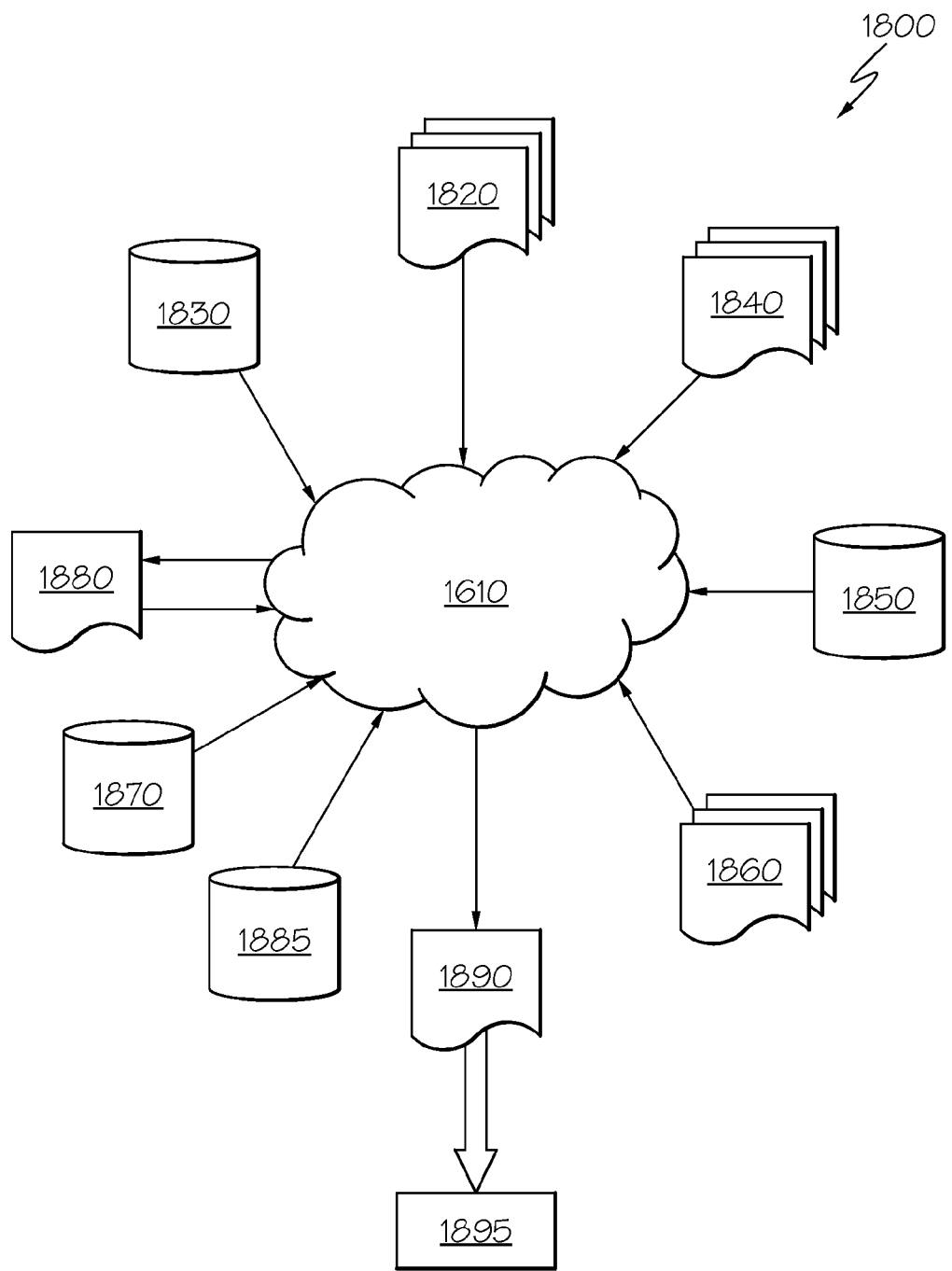
FIG. 18 is a flow diagram of a design process used in semiconductor design, manufacture, and/or test.

FIG. 18 shows a block diagram of an exemplary design flow 1800 used for example, in semiconductor IC logic design, simulation, test, layout, and manufacture. Design flow 1800 includes processes and mechanisms for processing design structures or devices to generate logically or otherwise functionally equivalent representations of the design structures and/or devices described above and shown in FIGS. 1-16. The design structures processed and/or generated by design flow 1800 may be encoded on computer-readable transmission or storage media to include data and/or instructions that when executed or otherwise processed on a data processing system generate a logically, structurally, mechanically, or otherwise functionally equivalent representation of hardware components, circuits, devices, or systems. Design flow 1800 may vary depending on the type of representation being designed. For example, a design flow 1800 for building an application specific IC (ASIC) may differ from a design flow 1800 for designing a standard component or from a design flow 1800 for instantiating the design into a programmable array, for example a programmable gate array (PGA) or a field programmable gate array (FPGA) offered by Altera® Inc. or Xilinx® Inc.

FIG. 18 illustrates multiple such design structures including an input design structure 1820 that is preferably processed by a design process 1810. Design structure 1820 may be a logical simulation design structure generated and processed by design process 1810 to produce a logically equivalent functional representation of a hardware device. Design structure 1820 may also or alternatively comprise data and/or program instructions that when processed by design process 1810, generate a functional representation of the physical structure of a hardware device. Whether representing functional and/or structural design features, design structure 1820 may be generated using electronic computer-aided design (ECAD) such as implemented by a core developer/designer. When encoded on a machine-readable data transmission, gate array, or storage medium, design structure 1820 may be accessed and processed by one or more hardware and/or software modules within design process 1810 to simulate or otherwise functionally represent an electronic component, circuit, electronic or logic module, apparatus, device, or system such as those shown in FIGS. 1-16. As such, design structure 1820 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1810 preferably employs and incorporates hardware and/or software modules for synthesizing, translating, or otherwise processing a design/simulation functional equivalent of the components, circuits, devices, or logic structures shown in FIGS. 1-16 to generate a netlist 1880 which may contain design structures such as design structure 1820. Netlist 1880 may comprise, for example, compiled or otherwise processed data structures representing a list of wires, discrete components, logic gates, control circuits, I/O devices, models, etc. that describes the connections to other elements and circuits in an integrated circuit design. Netlist 1880 may be synthesized using an iterative process in which netlist 1880 is resynthesized one or more times depending on design specifications and parameters for the device. As with other design structure types described herein, netlist 1880 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1810 may include hardware and software modules for processing a variety of input data structure types including netlist 1880. Such data structure types may reside, for example, within library elements 1830 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1840, characterization data 1850, verification data 1860, design rules 1870, and test data files 1885 which may include input test patterns, output test results, and other testing information. Design process 1810 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1810 without deviating from the scope and spirit of the invention. Design process 1810 may also include modules for performing standard circuit design processes such as timing analysis, verification, design rule checking, place and route operations, etc.

Design process 1810 employs and incorporates logic and physical design tools such as HDL compilers and simulation model build tools to process design structure 1820 together with some or all of the depicted supporting data structures along with any additional mechanical design or data (if applicable), to generate a second design structure 1890. Design structure 1890 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 1820, design structure 1890 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-16. In one embodiment, design structure 1890 may comprise a compiled, executable HDL simulation model that functionally simulates the devices shown in FIGS. 1-16.

Design structure 1890 may also employ a data format used for the exchange of layout data of integrated circuits and/or symbolic data format (e.g., information stored in a GDSII (GDS2), GL1, OASIS, map files, or any other suitable format for storing such design data structures). Design structure 1890 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-16. Design structure 1890 may then proceed to a stage 1895 where, for example, design structure 1890: proceeds to tape-out, is released to manufacturing, is released to a mask house, is sent to another design house, is sent back to the customer, etc.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A carbon-based semiconductor structure, the carbon-based semiconductor structure comprising:
   a substrate; and
   a gate stack, the gate stack comprising
      a carbon-based gate electrode formed on the substrate;
      a gate dielectric formed on the carbon-based gate electrode;
      a carbon-based channel on the gate dielectric;
   a source electrode directly contacting a first portion of the substrate, a first portion of the gate dielectric, and a first portion of the carbon-based channel; and
   a drain electrode directly contacting a second portion of the substrate, a second a portion of the gate dielectric, and a second portion of the carbon-based channel.

2. The carbon-based semiconductor structure of claim 1, further comprising:
   a set of spacers formed on at least a vertical portion of the gate stack.

3. The carbon-based semiconductor structure of claim 2, wherein the set of spacers comprises a height that is below a bottom surface of the carbon-based channel and above top surface of the carbon-based gate electrode.

4. The carbon-based semiconductor structure of claim 2, the source electrode further contacting a first spacer in the set of spacers, and the drain electrode further contacting a second portion of the carbon-based channel.

5. The carbon-based semiconductor structure of claim 1, further comprising:
   an oxide layer formed on the substrate.

6. The carbon-based semiconductor structure of claim 5, the source electrode further contacting a first portion of the oxide layer, and the drain electrode further contacting a second portion of the oxide layer.

7. A design flow product for fabricating an integrated circuit structure, the design flow product comprising an information processing system and a computer readable storage medium having program instructions embodied therewith, wherein the computer readable storage medium is not a transitory signal per se, wherein the information processing system executes the program instructions to cause the design flow product to perform a method comprising:
   forming a carbon-based gate electrode layer on a substrate;
   forming a gate dielectric layer on the carbon-based gate electrode layer;
   forming a carbon-based channel layer on the gate dielectric layer;
   patterning a mask on the carbon-based channel;
   removing portions of the carbon-based gate electrode layer, the gate dielectric layer, and the carbon-based channel layer unprotected by the mask, wherein the removing forms a gate stack under the mask comprising remaining portions of the carbon-based gate electrode layer, the gate dielectric layer, and the carbon-based channel layer.

8. The computer program product of claim 7, the method further comprising:
    forming an insulating layer over the substrate, the gate stack, and the mask; and
    removing a portion of the insulating layer, the removing forming a set of spacers on at least a vertical portion of the gate stack.

9. The computer program product of claim 8, the method further comprising:
    forming a conductive layer over the substrate, the spacers, the gate stack, and the mask;
    removing the mask; and
    removing a horizontal portion of the conductive layer over the gate stack, the removing defining and separating a source electrode and a drain electrode.

10. An integrated circuit comprising:
    a carbon-based semiconductor device, the carbon-based semiconductor device comprising:
        a substrate; and
        a gate stack, the gate stack comprising at least
            a carbon-based gate electrode formed on the substrate;
            a gate dielectric formed on the carbon-based gate electrode;
            a carbon-based channel on the gate dielectric;
        a source electrode directly contacting a first portion of the substrate, a first a portion of the gate dielectric, and a first portion of the carbon-based channel; and
        a drain electrode directly contacting a second portion of the substrate, a second a portion of the gate dielectric, and a second portion of the carbon-based channel.

11. The integrated circuit of claim 10, wherein the carbon-based semiconductor device further comprises:
    a set of spacers formed on at least a vertical portion of the gate stack.

12. The integrated circuit of claim 11, the source electrode further contacting a first spacer in the set of spacers, and the drain electrode further a second spacer in the set of spacers.

13. The integrated circuit of claim 10, wherein the carbon-based semiconductor device further comprises:
    an oxide layer formed on the substrate.

14. The integrated circuit of claim 13 the source electrode further contacting a first portion of the oxide layer, first portion of the gate dielectric, and a first portion of the carbon-based channel; and the drain electrode further contacting a second portion of the oxide layer.

* * * * *